(12) United States Patent
Truesdale

(10) Patent No.: US 7,564,167 B2
(45) Date of Patent: Jul. 21, 2009

(54) SYSTEM AND METHOD OF ASSEMBLING A TRAPPED ACOUSTIC WAVE SYSTEM

(75) Inventor: Brian J. Truesdale, Wauconda, IL (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 12/116,318

(22) Filed: May 7, 2008

(65) Prior Publication Data

US 2008/0315976 A1     Dec. 25, 2008

Related U.S. Application Data

(60) Provisional application No. 60/936,393, filed on Jun. 20, 2007.

(51) Int. Cl.
*H01L 41/08* (2006.01)
(52) U.S. Cl. .................................. 310/320; 310/348
(58) Field of Classification Search ............... 310/320, 310/322, 324
See application file for complete search history.

(56) References Cited

U.S. PATENT DOCUMENTS

| | | | | |
|---|---|---|---|---|
| 5,469,012 A | * | 11/1995 | Suzuki et al. | 310/348 |
| 5,814,920 A | * | 9/1998 | Takeuchi et al. | 310/330 |
| 5,850,677 A | * | 12/1998 | Ryoichi | 29/25.35 |
| 6,218,766 B1 | * | 4/2001 | Warnaka et al. | 310/322 |
| 7,019,438 B2 | * | 3/2006 | Takahashi et al. | 310/324 |
| 7,106,310 B2 | * | 9/2006 | Knowles et al. | 345/177 |

* cited by examiner

*Primary Examiner*—Mark Budd
(74) *Attorney, Agent, or Firm*—Mark W. Croll; Paul F. Donovan

(57) ABSTRACT

Embodiments of the present invention provide a trapped acoustic wave system and a method of assembling such a system. The system may include a substrate having an acoustic wave cavity and a transducer mounted on the substrate. The transducer is configured to resonate the acoustic wave cavity. An acoustically transmissive adhesive secures a first portion of the transducer to the substrate. An additional adhesive, which is separate and distinct from the acoustically transmissive adhesive, anchors at least a second portion of the transducer to the substrate.

5 Claims, 4 Drawing Sheets

SYSTEM AND METHOD OF ASSEMBLING A TRAPPED ACOUSTIC WAVE SYSTEM

RELATED APPLICATIONS

This application relates to and claims priority benefits from U.S. Provisional Patent Application No. 60/936,393 entitled "System and Method of Assembling a Trapped Acoustic Resonance Sensor to a Substrate," filed Jun. 20, 2007, which is hereby incorporated by reference in its entirety.

FIELD OF THE INVENTION

Embodiments of the present invention generally relate to an acoustic wave touch actuated system and more particularly to a system and method of securing a trapped acoustic resonance sensor to a substrate.

BACKGROUND OF THE INVENTION

U.S. Pat. No. 7,106,310, entitled "Acoustic Wave Touch Actuated Switch" (the "'310 patent"), discloses an acoustic wave switch that includes a substrate with an acoustic wave cavity, or resonator, formed therein such that the mass per unit area of the acoustic cavity is greater than the mass per unit area of the substrate adjacent the acoustic cavity. A transducer is mounted on the acoustic cavity for generating an acoustic wave that is substantially trapped in the cavity. A touch on the touch surface of the acoustic cavity absorbs acoustic wave energy and can produce a detectable change in the impedance of the transducer.

As noted above, the '310 patent discloses a system in which a touch can be detected based on a change in impedance of the transducer. Optionally, a control system can detect a sensed event, such as a touch on an acoustic wave switch/sensor, such as shown and described in the '310 patent, based on the time that it takes for an acoustic wave signal from the transducer to decay to a predetermined level. Such a system and method is described in United States Patent Application Publication No. 2004/0246239, entitled "Acoustic Wave Touch Detection Circuit and Method" (the "'239 application").

The '310 patent and the '239 application both disclose systems in which a plurality of acoustic wave cavities or resonators are positioned on a substrate. As noted in the '310 patent, the substrate may be formed of metal, plastic, glass, ceramics, etc. that are capable of supporting a resonant acoustic wave.

In order to manufacture an acoustic wave switch, a transducer is bonded to a substrate or panel with an adhesive. A circuit board assembly connects to the transducer.

FIG. 1 illustrates a bottom view of an acoustic wave switch 10. FIG. 2 illustrates a cross-sectional view of the acoustic wave switch 10 through line 2-2 of FIG. 1. Referring to FIGS. 1 and 2, the acoustic wave switch 10 includes a substrate 12 having a mesa 14 defined by an acoustic cavity moat 16. A transducer 18, such as a PZT (Lead Zirconate Titanate) transducer, is secured to the substrate 12 through an adhesive 20. In particular, the transducer 18 is adhesively bonded to a surface of an acoustic wave cavity 22.

In order to manufacture a functional acoustic wave switch 10, care is taken to use an appropriate adhesive 20, such as an acoustically transmissive epoxy, and ensure a proper bondline thickness. For example, adhesives 20 with particular acoustic properties are used in order to ensure that the transducer 18 is able to resonate the acoustic wave cavity 22. Further, an overly thick bondline may dampen or impede resonance within the acoustic wave cavity 22. In general, a thin, rigid bond is effective in transferring energy from the transducer 18 to the acoustic wave cavity 22 with minimal energy loss. Various types of epoxies, such as those manufactured and sold by Bondline Electronic Adhesives of Sunnyvale, Calif., may be used.

In general, various types of adhesives may be used to produce a functional acoustic wave system. For example, epoxies, cyanoacrylates and methacrylates may be used to bond the transducer 18 to the substrate 12. Epoxies are particularly well-suited due to the strength and reliability of the subsequent bond.

Epoxies typically require, however, several minutes, or even hours, to cure. As such, the manufacturing process may be long and costly. During the manufacturing process, the transducer 18 is forced into or onto the substrate 12 (i.e., pressure is applied to the transducer 18 in order to force it onto or into the substrate 12) in order to minimize the bond thickness (thereby increasing the efficiency of the acoustic wave transfer). Typically, heat is applied to the system during assembly for at least one hour in order to cure the adhesive 20.

Customized clamping jigs and fixtures are typically used during the manufacturing process. Clamps and fixtures are used to secure the transducer 18 to the substrate 12 during the curing process so that the transducer 18 does not shift with respect to the substrate 12. The clamping jigs and fixtures are placed in a curing oven with the product and must withstand the temperature and abuse of the curing process. Thus, the clamping jigs and fixtures are typically expensive components. Moreover, the clamping jigs and fixtures take up considerable oven space, are typically specific to a given product and are not readily adaptable for use with respect to other products.

Consequently, the capital, equipment and manpower used to manufacture acoustic wave switches are relatively high. Thus, a particular manufacturer may find the costs, labor and time associated with such a manufacturing process to be prohibitively high.

SUMMARY OF THE INVENTION

Embodiments of the present invention provide a system and method of manufacturing an acoustic wave system that does not require the use of clamping jigs or fixtures. As such, more space is available within a curing oven for product to be placed.

Certain embodiments of the present invention provide a trapped acoustic wave system that includes a substrate having an acoustic wave cavity and a transducer mounted on the substrate. The transducer is configured to resonate the acoustic wave cavity. An acoustically transmissive adhesive, such as an epoxy, secures a first portion of the transducer to the substrate. An additional adhesive anchors at least a second portion, such as opposite ends, of the transducer to the substrate before, during and after a curing process that cures the acoustically transmissive adhesive. The acoustically transmissive adhesive is cured in an oven in order to securely fasten the transducer to the substrate The additional adhesive may include an ultraviolet (UV) cure adhesive. The UV cure adhesive is cured by a source of UV light in order to tack-bond the second portion of the transducer to the substrate.

The transducer may be symmetrically aligned with respect to a central axis of the acoustic wave cavity. That is, the transducer may be centered on the substrate with respect to the central axis of the acoustic wave cavity.

Certain embodiments of the present invention provide a method of assembling a trapped acoustic wave system. The method may include applying an acoustically transmissive adhesive (such as an epoxy) on a first area of a substrate, applying an ultraviolet (UV) cure adhesive on at least one second area of the substrate, aligning a transducer with respect to the acoustically transmissive adhesive and the UV cure adhesive, urging the transducer into the acoustically transmissive adhesive and the UV cure adhesive, wherein said urging mounts the transducer on the substrate. The method also includes exposing the mounted transducer to UV light, curing the UV cure adhesive through the exposing, tack-bonding the transducer to the substrate through the curing the UV cure adhesive, heating the transducer and the substrate in an oven, curing the acoustically transmissive adhesive through the heating, and securely fastening the transducer to the substrate through the curing the acoustically transmissive adhesive.

The first area of the substrate may be along a longitudinal axis of the substrate. The at least one second area of the substrate may be perpendicular to the longitudinal axis of the substrate. The aligning may include aligning at least one end of the transducer with respect to the UV cure adhesive.

Figure 1:
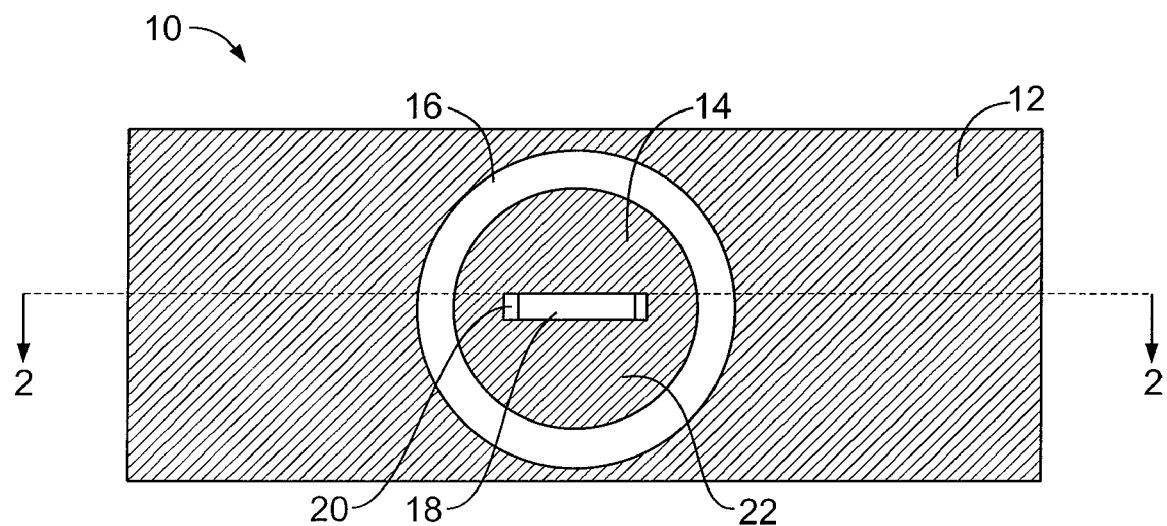
FIG. 1 illustrates a bottom view of an acoustic wave switch.
Figure 2:
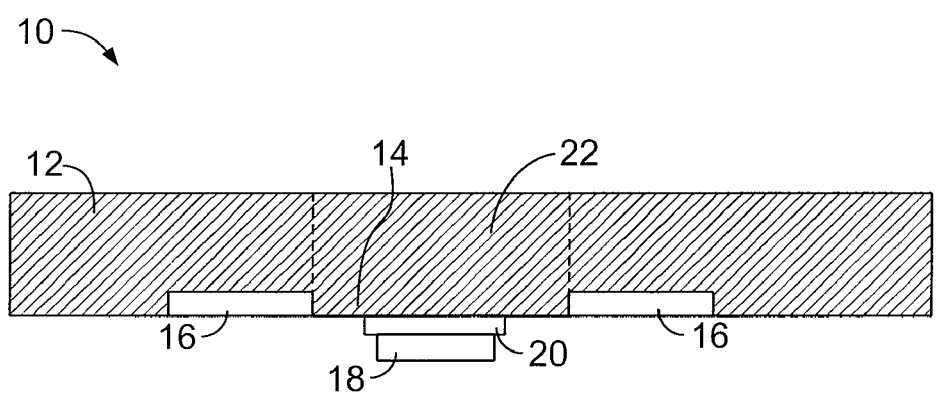
FIG. 2 illustrates a cross-sectional view of an acoustic wave switch through line 2-2 of FIG. 1.

Before the embodiments of the invention are explained in detail, it is to be understood that the invention is not limited in its application to the details of construction and the arrangement of the components set forth in the following description or illustrated in the drawings. The invention is capable of other embodiments and of being practiced or being carried out in various ways. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof.

DETAILED DESCRIPTION OF THE INVENTION

Figure 3:
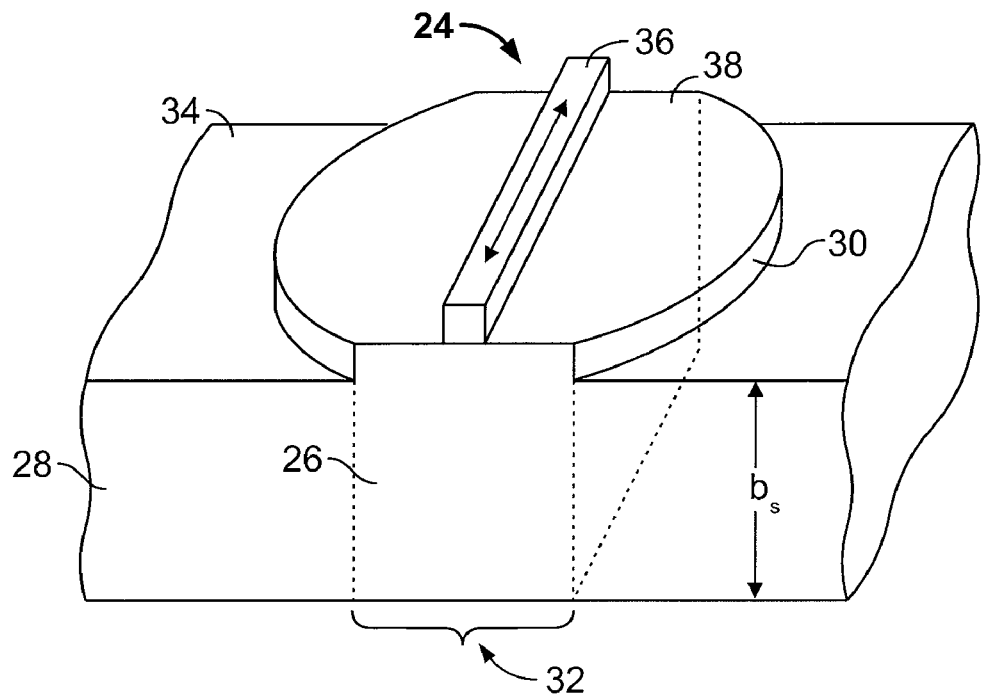
FIG. 3 illustrates a side cross-sectional view of an acoustic wave system, according to an embodiment of the present invention.

FIG. 3 illustrates a side cross-sectional view of an acoustic wave system 24, according to an embodiment of the present invention. The acoustic wave system 24 includes an associated acoustic wave cavity, or resonator 26 that extends through the thickness $b_s$ of a substrate 28. As shown in FIG. 3, the acoustic wave cavity 26 extends above adjacent surfaces of the substrate 28. Optionally, the acoustic wave cavity 26 may be surrounded by a cavity moat.

The acoustic wave cavity 26 is formed in the substrate 28 such that the mass per unit surface area of the acoustic wave cavity 26 is greater than the mass per unit surface area of the substrate 28 adjacent the acoustic wave cavity 26. In one embodiment, the mass per unit area of the substrate in the switch region is increased to form the acoustic wave cavity 26 by forming a thin plateau or mesa 30 on a surface of the substrate 28 that is parallel to the plane of the substrate 26 and/or a touch surface 32. The mesa 30 may be formed on a bottom surface 34 of the substrate 28 opposite the touch surface 32 of the acoustic wave cavity 26. Alternatively, the mesa 30 may be formed on the touch surface 32.

As discussed below, a transducer 36 is mounted on a surface 38 of the acoustic wave cavity 26 to generate an acoustic wave that is substantially trapped or localized in the acoustic wave cavity 26. Although the transducer 36 is shown as being mounted on the mesa 30, if the mesa 30 is formed on the touch surface 32 of the substrate 28, the transducer 36 may be mounted directly on the substrate surface of the acoustic wave cavity 26 opposite the mesa 30 so that the transducer 36 is on the opposite side of the substrate 28. The transducer 36 is electrically connected to a processing unit (not shown) and/or a sensing circuit (not shown).

The acoustic wave system 24 can use any type of acoustic wave capable of being substantially trapped in a particular acoustic wave cavity 26. For simplicity, the acoustic wave switch 24 is described using a shear wave in a direction that is in the plane of the substrate 28, wherein the shear wave energy extends in a direction perpendicular to the plane of the substrate 28, that is, through the thickness of the substrate 28. A shear wave is advantageous because it is insensitive to liquids and other contaminants on the touch surface 32. Because the fundamental or zeroth order mode of a horizontally polarized shear wave may not be substantially trapped, higher order shear wave modes are used in accordance with embodiments of the present invention. It should be appreciated that because the acoustic wave used is trapped, the wave is a standing wave. A standing wave has a number of advantages over an acoustic wave that propagates or travels along a path in a substrate. For example, propagating waves are not confined to the main path of propagation but can diffract off of the main path complicating touch detection. This is opposed to a standing wave which by its nature is confined to the area of a particular acoustic wave cavity 26. Because the acoustic wave is confined, touch detection is easily accomplished. Further, the wave energy of a propagating wave is not stored at any location along the path. Once the wave passes a point along the path, the wave is gone, thereby making timing and control critical for touch detection with propagating waves. There are no timing or control issues with a standing wave because the wave energy is stored in the acoustic wave cavity 26. Moreover, a propagating wave is not a resonating wave. As such, the wave energy decays as it travels. A standing wave is resonant so that the wave is reinforced and prolonged. As a result, the standing wave has a much greater amplitude than a wave that is not confined. The construction and operation of each acoustic wave cavity 26 is further described in U.S. Pat. No. 7,106,310, entitled "Acoustic Wave Touch Actuated Switch" (The "'310 patent"), which is hereby incorporated by reference in its entirety.

The acoustic wave switch described in the '310 patent has a high Q (the ratio of the stored energy to lost or dissipated energy over a complete cycle) so as to enable a touch to be detected by extremely simple, low-cost circuitry. The acoustic wave switch is rugged, explosion proof, operates in the presence of liquids and other contaminants (unlike capacitive sensors), has a lower power consumption and may be incorporated and integrally formed in a wall of a housing for a device.

The acoustic wave system 24 may be connected to an extremely simple touch detection or sensing circuit, such as shown and described in the '310 patent. For example, the transducer 36 may be coupled to a multiplexer that sequentially couples the transducer 36 to an oscillator, as discussed in the '310 patent. Embodiments of the present invention may detect a touch on a respective touch surface 32 through a detected change in impedance, as described in the '310 patent.

Optionally, embodiments of the present invention may detect a touch on a respective touch surface 32 by measuring the decay time of the acoustic wave within a particular acoustic wave cavity 26. United States Patent Application Publication No. 2004/0246239, entitled "Acoustic Wave Touch Detection Circuit and Method" (the "'239 application"), which is hereby incorporated by reference in its entirety, describes a controller that detects a sensed event such as a touch on an acoustic wave switch/sensor based on the time it takes for the trapped wave to decay. The trapped acoustic wave within the acoustic cavity, or resonator, acts to "ring" the acoustic cavity. That is, as a voltage is applied to transducer, the transducer operates to resonate the acoustic cavity.

Operational details of the acoustic wave system 24 are described in the '310 patent and the '239 application. As discussed below, embodiments of the present invention provide an efficient system and method of securing the transducer 36 to the substrate 28.

Figure 4:
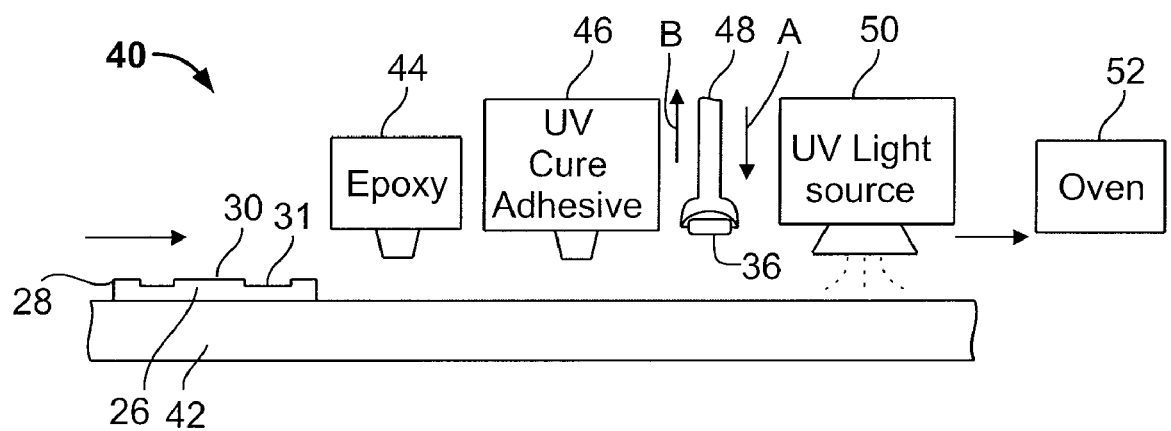
FIG. 4 illustrates a schematic representation of a system for securing a transducer to a substrate, according to an embodiment of the present invention.

FIG. 4 illustrates a schematic representation of a system 40 for securing the transducer 36 to the substrate 28, according to an embodiment of the present invention. The system 40 may include a conveyor line 42 that moves the substrate 28 underneath an epoxy applicator 44, an ultraviolet (UV) cure adhesive applicator 46, a transducer mounting assembly 48, a UV light source 50, and ultimately to a curing oven 52. While the substrate 28 is shown on the conveyor line 42, the system 40 may optionally not include the conveyor line 42. Instead, the various components of the system, such as the epoxy applicator 44, may be supported on a table and an operator may bring the substrate 28 to each particular component.

Moreover, in the electronics assembly industry, equipment is available to robotically pick up small components and place them on a circuit board for assembly at a relatively low cost. Embodiments of the present invention can be used with such a pick and place system and process.

As an initial step, the substrate 28 and transducer 36 are first cleaned and prepared for bonding. After cleaning, the substrate 28 is first moved in close proximity to the epoxy applicator 44. The epoxy applicator 44 applies a layer of epoxy on a portion of the mesa 30, which may or may not be surrounded by a cavity moat 31.

Figure 5:
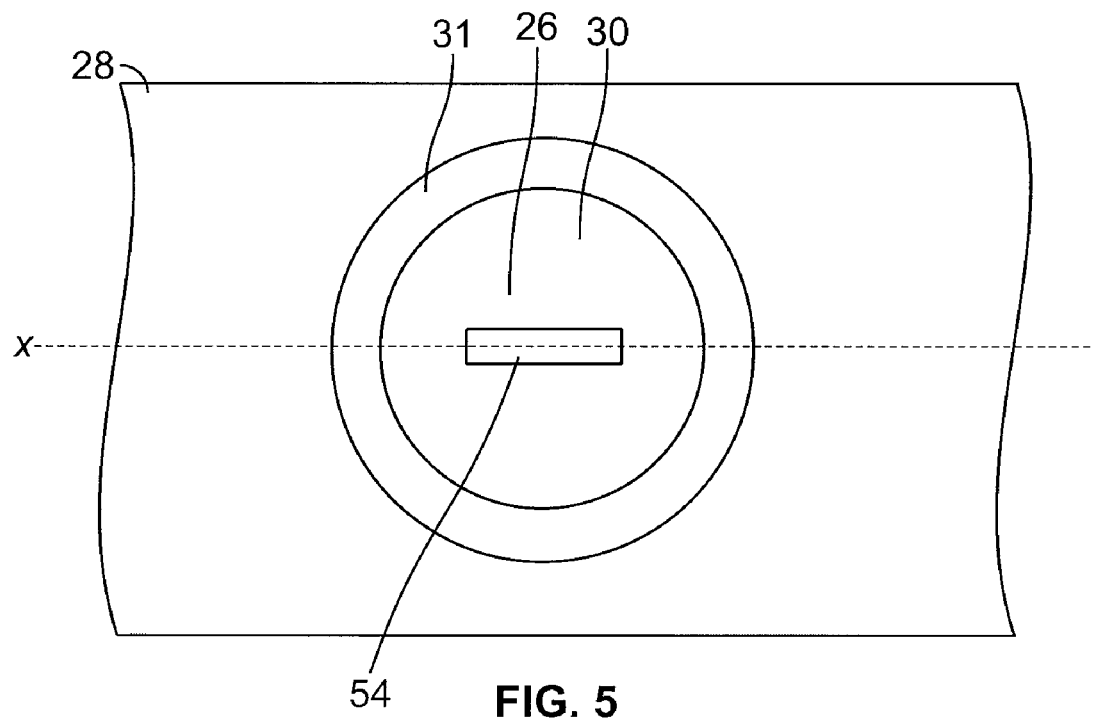
FIG. 5 illustrates a substrate having an epoxy layer deposited thereon, according to an embodiment of the present invention.

FIG. 5 illustrates a substrate 28 having an epoxy layer 54 deposited thereon, according to an embodiment of the present invention. As shown in FIG. 5, the epoxy layer 54 may be deposited in the center of the mesa 30 approximately along a longitudinal axis x of the substrate 28. Ultimately, the epoxy layer 54 will secure the transducer 36 to the substrate 28. The central location of the transducer 36 with respect to the mesa 30 provides uniform trapped acoustic waves within the acoustic wave cavity 26 during operation of the acoustic wave system 24 (shown in FIG. 3). Alternatively, instead of an epoxy, other types of adhesives, such as cyanoacrylates and methacrylates, may be used to ultimately bond the transducer 36 to the substrate 28. Epoxies are particularly well-suited, however, due to the strength and reliability of the subsequent bond.

Referring to FIGS. 4-5, after the epoxy layer 54 is deposited on the mesa 30, the substrate 28 is moved to the UV cure adhesive applicator 46, which deposits a layer of UV cure adhesive, such as Dymax Corp.'s 621 UV gel or any other such UV adhesive that bonds to metal, on the substrate 28. The UV cure adhesive is generally deposited about a peripheral portion (particularly, longitudinal ends) of the epoxy layer 54.

Figure 6:
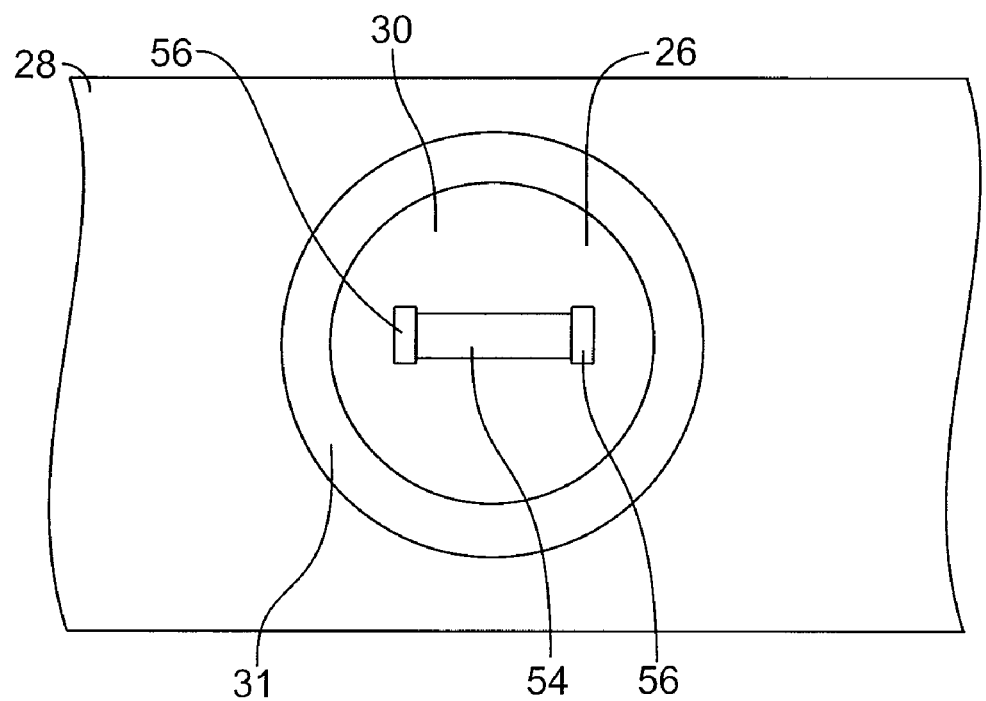
FIG. 6 illustrates a substrate having UV cure adhesive deposited at longitudinal ends of an epoxy layer, according to an embodiment of the present invention.

FIG. 6 illustrates the substrate 28 having UV cure adhesive 56 deposited at longitudinal ends of the epoxy layer 54, according to an embodiment of the present invention. The UV cure adhesive 56 anchors the transducer 36 to the substrate 28 during the bonding process. That is, the UV cure adhesive 56 anchors ends of the transducer 36 to the mesa 30, or other portion of the substrate 28. Optionally, the UV cure adhesive 56 may be deposited at only one end of the epoxy layer 54, around a perimeter of the epoxy layer 54, or at various other points. However, positioning the UV cure adhesive 56 at opposite ends of the epoxy layer 54 securely anchors both ends of the transducer 36 in position. Further, the UV cure adhesive 56 may not have the same acoustic properties as that of the epoxy layer 54. Thus, limited amounts of UV cure adhesive 56 may be desired. Locating the UV adhesive cure 56 at opposite ends of the transducer 36 ensures that the transducer 36 ultimately is able to emit acoustic wave energy through the transmissive epoxy.

Referring to FIGS. 4 and 6, once the epoxy layer 54 and UV cure adhesive 56 are deposited on the substrate 28, the transducer 36 is aligned over the epoxy layer 54 and the UV cure adhesive 56. That is, the ends of the transducer 36 are mounted over the UV cure adhesive 56. After the transducer 36 is aligned in such fashion, the transducer mounting assembly 48, which may be a robotically controlled actuation arm, urges the transducer 36 into the substrate 28 in the direction of arrow A. The mounting assembly 48 presses the transducer 36 into the substrate 28 until a suitable bond line is formed between the transducer 36 and the epoxy layer 54 and the UV cure adhesive 56.

Alternatively, the UV cure adhesive 56 may be deposited on the substrate 28 before the epoxy layer 54. That is, the substrate 28 may pass by or through the UV cure adhesive applicator 46 before the epoxy applicator 44.

Figure 7:
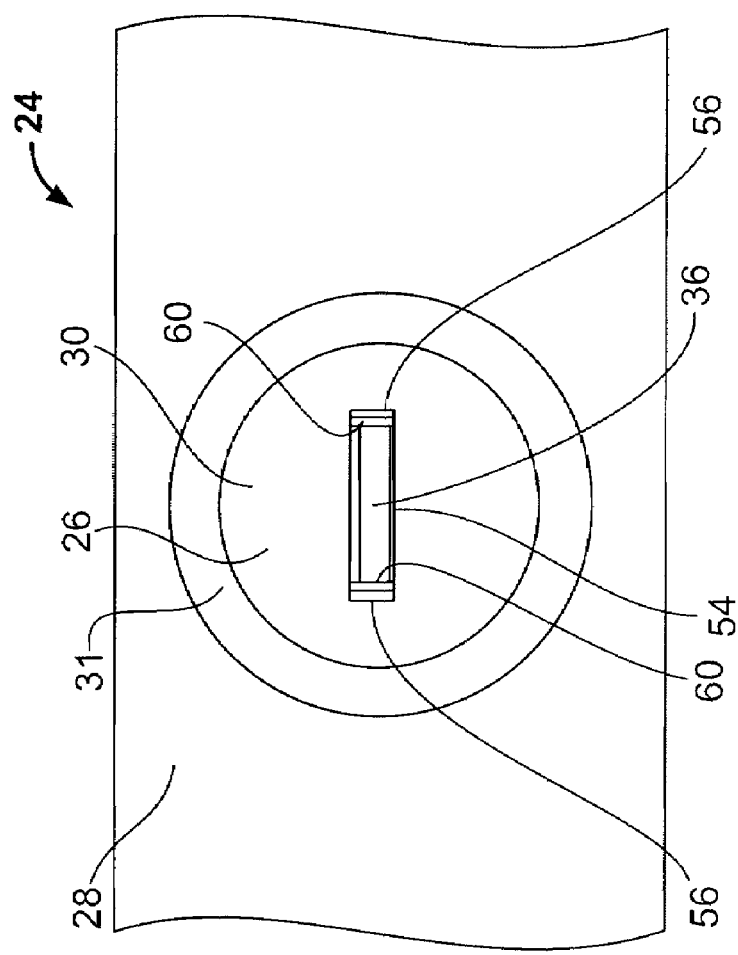
FIG. 7 illustrates a transducer mounted on a substrate, according to an embodiment of the present invention.

FIG. 7 illustrates the transducer 36 mounted on the substrate 28, according to an embodiment of the present invention. As shown in FIG. 7, the ends 60 of the transducer 36 abut the UV adhesive 56, which may or may not overlap the epoxy layer 54. Most of the transducer 36 abuts the epoxy layer 54.

Referring to FIGS. 4 and 7, after the transducer 36 is properly positioned, the mounting assembly 48 releases the transducer 36 and moves away from the substrate 28 in the direction of arrow B. The substrate 28 and mounted transducer 36 are passed underneath or through the UV light source 50. The UV light source 50 emits UV radiation that quickly cures the UV cure adhesive 56, thereby tack-bonding and securely anchoring the transducer 36 to the substrate 28. The UV cure adhesive 56 may not exhibit the same acoustic frequency of the epoxy layer 54, but the UV cure adhesive 56 cures in a very short time, such as 3-5 seconds, when exposed to a concentrated UV light source.

The substrate 28 and the mounted transducer 36, which form the acoustic wave system 24, are then placed in the curing oven 52, which generates heat that cures the epoxy layer 54. The epoxy later 54 may take about an hour to cure. However, the UV cure adhesive 56, having already been cured by the UV radiation, ensures that that the transducer 36 is secured in place during the epoxy curing process. The cured epoxy layer 54 secures the transducer 36 in position, while at the same time providing a transmissive medium for trapped acoustic waves to pass.

Figure 8:
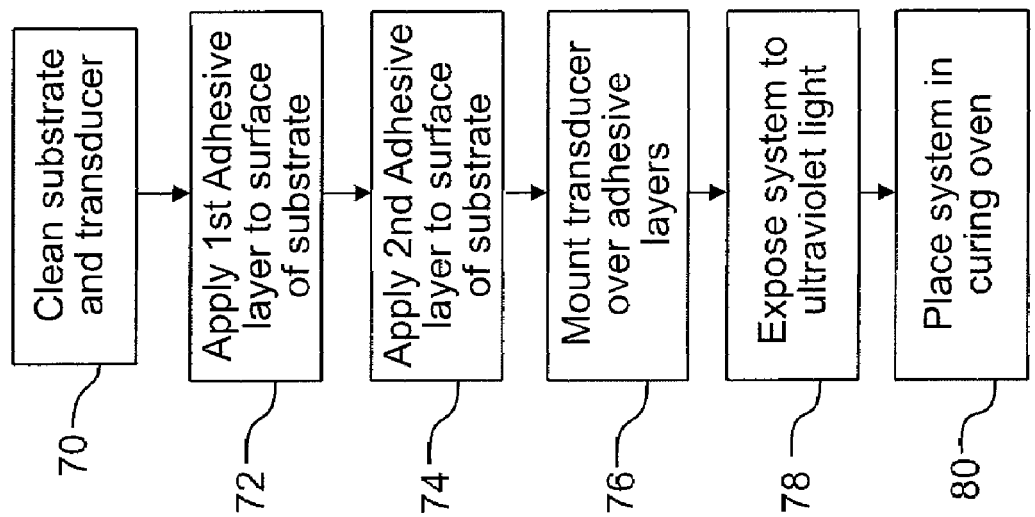
FIG. 8 illustrates a flow chart of a method of securing a transducer to a substrate, according to an embodiment of the present invention.

FIG. 8 illustrates a flow chart of a method of securing a transducer to a substrate, according to an embodiment of the present invention. At 70, the substrate and transducer are both cleaned. Next, at 72, a first adhesive, such as an epoxy, is applied to a surface of the substrate. At 74, a second adhesive, such as a UV cure adhesive, is applied to the surface of the substrate. Once the adhesives are deposited on the surface of the substrate, the transducer is aligned and mounted onto the adhesive layers. The acoustic wave system, including the substrate and transducer, are then exposed to ultraviolet (UV) light at 78. The UV light cures the UV cure adhesive and tack-bonds the transducer to the substrate. Consequently, the transducer is securely anchored with respect to the substrate. The acoustic wave system is then placed in a curing oven at 80. The heat generated within the oven cures the epoxy, thereby securely bonding the transducer to the substrate.

Embodiments of the present invention may be used with automated adhesive dispensing equipment and/or pick and place robotics, thereby eliminating custom fixtures specific to each product. Embodiments of the present invention eliminate the need for expensive, heat-resistant clamping fixtures, and large quantities of clamping fixtures. Embodiments of the present invention also increase the available amount of space within a curing oven due to the fact that obtrusive clamping fixtures are not required. Further, embodiments of the present invention may be used with an in-line manufacturing process rather than batch processing.

While various spatial and directional terms, such as top, bottom, lower, mid, lateral, horizontal, vertical, front and the like may used to describe embodiments of the present invention, it is understood that such terms are merely used with respect to the orientations shown in the drawings. The orientations may be inverted, rotated, or otherwise changed, such that an upper portion is a lower portion, and vice versa, horizontal becomes vertical, and the like.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

Various features of the invention are set forth in the following claims.

The invention claimed is:

1. A trapped acoustic wave system comprising:
   a substrate having an acoustic wave cavity connected to a mesa;
   a transducer mounted on said substrate, said transducer having first and second ends connected by a main portion, wherein said transducer is symmetrically aligned with respect to a central axis of said acoustic wave cavity, said transducer configured to resonate said acoustic wave cavity;
   an ultraviolet (UV) adhesive anchoring said first and second ends of said transducer to said substrate; and
   an epoxy securing said main portion of said transducer to said substrate, wherein said UV adhesive anchors said first and second ends of said transducer to said substrate before and during an epoxy curing process.

2. The system of claim 1, wherein said UV cure adhesive is cured by a source of UV light in order to tack-bond said first and second ends of said transducer to said substrate.

3. The system of claim 1, wherein said transducer is mounted on a surface of said mesa.

4. The system of claim 1, wherein said epoxy is cured in an oven in order to securely fasten said main portion to said substrate.

5. The system of claim 1, wherein said first and second ends of said transducer are opposite ends of said transducer.

* * * * *